(12) United States Patent
Iizuka et al.

(10) Patent No.: US 11,328,945 B2
(45) Date of Patent: May 10, 2022

(54) WAFER FORMING APPARATUS

(71) Applicant: DISCO CORPORATION, Tokyo (JP)

(72) Inventors: Kentaro Iizuka, Tokyo (JP); Ryohei Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/211,176

(22) Filed: Mar. 24, 2021

(65) Prior Publication Data

US 2021/0327733 A1  Oct. 21, 2021

(30) Foreign Application Priority Data

Apr. 16, 2020 (JP) .............................. JP2020-073430

(51) Int. Cl.
*H01L 21/67* (2006.01)
*H01L 21/677* (2006.01)

(52) U.S. Cl.
CPC .. *H01L 21/67294* (2013.01); *H01L 21/67706* (2013.01); *H01L 21/67736* (2013.01)

(58) Field of Classification Search
CPC combination set(s) only.
See application file for complete search history.

(56) References Cited

FOREIGN PATENT DOCUMENTS

| JP | 2000094221 A | 4/2000 |
|---|---|---|
| JP | 2019106458 A | 6/2019 |

*Primary Examiner* — Ronald P Jarrett
(74) *Attorney, Agent, or Firm* — Greer Burns & Crain Ltd.

(57) ABSTRACT

A wafer forming apparatus includes a conveying tray having an ingot accommodating section that accommodates a semiconductor ingot and a wafer accommodating section that accommodates a wafer formed from the semiconductor ingot, a belt conveyor unit that conveys the conveying tray to each processing apparatus, a cassette rack on which cassettes accommodating the wafers are placed correspondingly to the conveying trays, and a transferring unit that transfers the wafer from the wafer accommodating section of the conveying tray to the cassette placed on the cassette rack. The conveying tray is provided with an identification mark. The cassette rack or the cassette corresponding to the conveying tray is provided with the same identification mark as the identification mark provided on the conveying tray.

2 Claims, 3 Drawing Sheets

WAFER FORMING APPARATUS

BACKGROUND OF THE INVENTION

Field of the Invention

The present invention relates to a wafer forming apparatus for forming a wafer from a semiconductor ingot.

Description of the Related Art

Devices such as integrated circuits (ICs), large scale integrated (LSI) circuits, and light emitting diodes (LEDs) are formed in a functional layer stacked on a front surface of a wafer formed from silicon (Si) or sapphire ($Al_2O_3$) or the like while partitioned by streets. In addition, power devices, LEDs or the like are formed in a functional layer stacked on a front surface of a wafer formed from single crystal silicon carbide (single crystal SiC) while partitioned by streets. The wafer formed with the devices is processed along the streets by a cutting apparatus or a laser processing apparatus to be divided into individual device chips, and the divided device chips are utilized for electric apparatuses such as mobile phones and personal computers.

The wafer to be formed with the devices is generally formed by cutting a cylindrical semiconductor ingot to a thin form by a wire saw. The front surface and a back surface of the wafer thus cut are finished to mirror surface by polishing (see, for example, Japanese Patent Laid-open No. 2000-94221). However, when the semiconductor ingot is cut by the wire saw and the front surface and the back surface of the wafer thus cut are polished, most part (70% to 80%) of the semiconductor ingot is thrown away, which is uneconomical. Particularly, the single crystal SiC ingot is high in hardness, is difficult to cut by a wire saw, and the cutting requires considerable time, so that productivity is poor. In addition, the semiconductor ingot is high in unit price, and there is problem in efficiently forming the wafers.

In view of this, proposed has been a wafer forming apparatus in which a laser beam of such a wavelength as to be transmitted through the single crystal SiC is applied to the single crystal SiC ingot with a focal point of the laser beam positioned inside the single crystal SiC ingot, to form a peeling layer at a scheduled cutting plane, and the wafer is peeled off from the single crystal SiC ingot along the scheduled cutting plane formed with the peeling layer (see, for example, Japanese Patent Laid-open No. 2019-106458).

In addition, in the wafer forming apparatus disclosed in Japanese Patent Laid-open No. 2019-106458, a series of works including constantly placing several conveying trays (for example, four conveying trays) on a belt conveyor unit, conveying the semiconductor ingot to each processing apparatus by the belt conveyor unit to form a wafer from the semiconductor ingot, accommodating the wafer in the same conveying tray as that for the semiconductor ingot from which the wafer is formed, and accommodating the wafer in a cassette stringed to the semiconductor ingot in a wafer conveying-out region can be performed efficiently.

SUMMARY OF THE INVENTION

However, when the operation of the wafer forming apparatus is stopped due to service interruption or a trouble, the conveying tray is conveyed out from the belt conveyor unit and thereafter the operation is again started, it may be impossible to accommodate the wafer in the cassette stringed to the semiconductor ingot, and the parent-child relation between the semiconductor ingot and the wafer may become unclear.

Accordingly, it is an object of the present invention to provide a wafer forming apparatus that ensures that even upon generation of service interruption or a trouble, the parent-child relation between a semiconductor ingot and a wafer is not broken but is always clear.

In accordance with an aspect of the present invention, there is provided a wafer forming apparatus for forming a wafer from a semiconductor ingot, the wafer forming apparatus including a conveying tray having an ingot accommodating section that accommodates the semiconductor ingot and a wafer accommodating section that accommodates the wafer formed from the semiconductor ingot, a belt conveyor unit that conveys the conveying tray to each processing apparatus, a cassette rack on which cassettes accommodating the wafers are placed correspondingly to the conveying trays, and a transferring unit that transfers the wafer from the wafer accommodating section of the conveying tray to the cassette placed on the cassette rack, in which the conveying tray is provided with an identification mark, and the cassette rack or the cassette corresponding to the conveying tray is provided with the same identification mark as the identification mark provided on the conveying tray.

Preferably, the identification mark is any one of a color, a symbol, a character, a figure, a pattern, and a picture or a combination thereof.

According to the present invention, even in the case where service interruption or a trouble is generated and the operation of a wafer processing apparatus is stopped, a wafer can be securely accommodated in a cassette stringed to a semiconductor ingot, and the parent-child relation between the semiconductor ingot and the wafer is not broken but is always clear.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
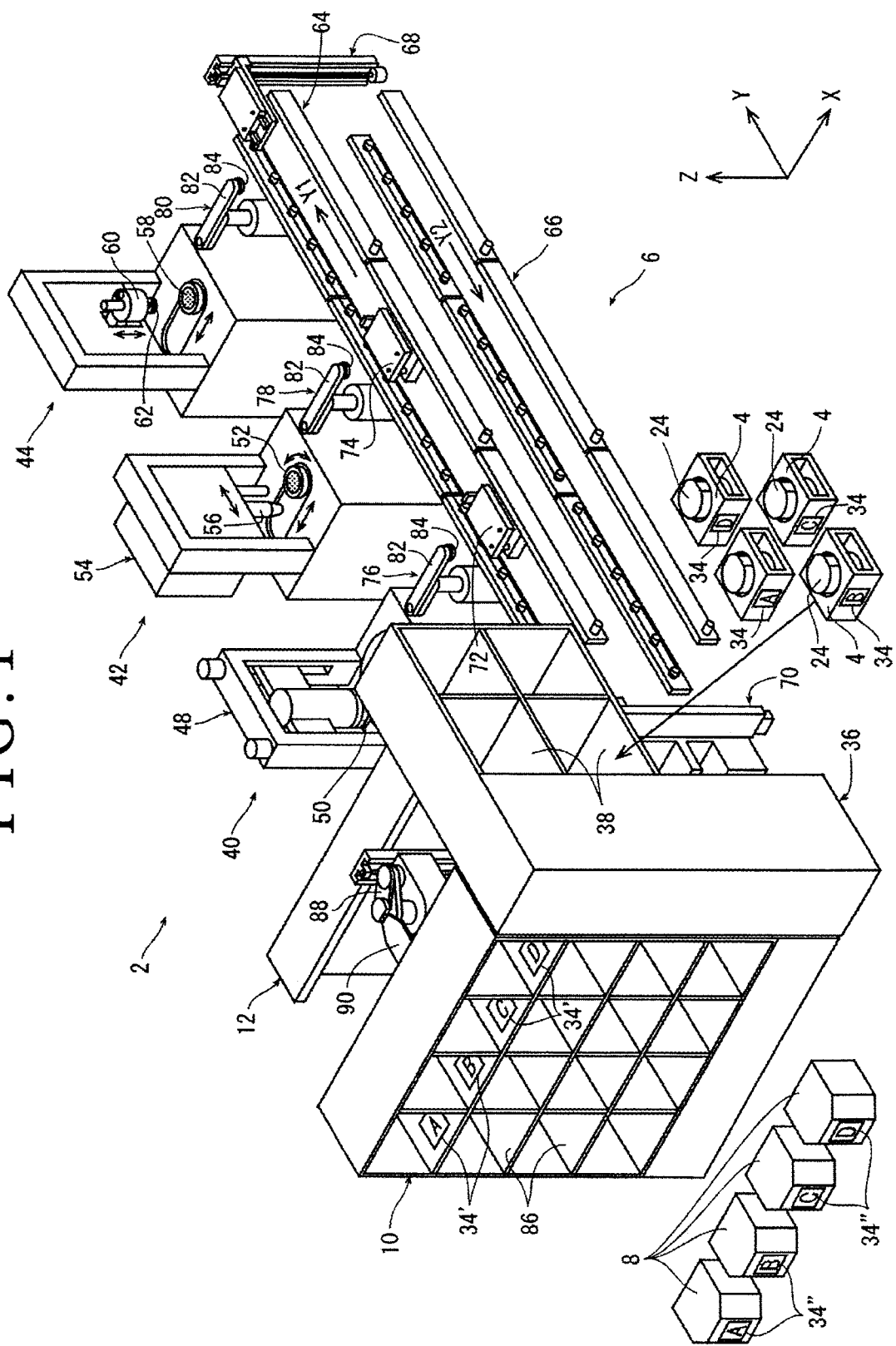
FIG. 1 is a perspective view of a wafer forming apparatus according to an embodiment of the present invention.

A wafer forming apparatus according to an embodiment of the present invention will be described below referring to the drawings. The wafer forming apparatus 2 illustrated in FIG. 1 includes a conveying tray 4 that accommodates a semiconductor ingot (hereinafter referred to simply as ingot) and a wafer, a belt conveyor unit 6 that conveys the conveying tray 4 to each processing apparatus, a cassette rack 10 on which cassettes 8 accommodating the wafers are placed correspondingly to the conveying trays 4, and a transferring unit 12 that transfers the wafer from the conveying tray 4 to the cassette 8 placed on the cassette rack 10.

Figure 2:
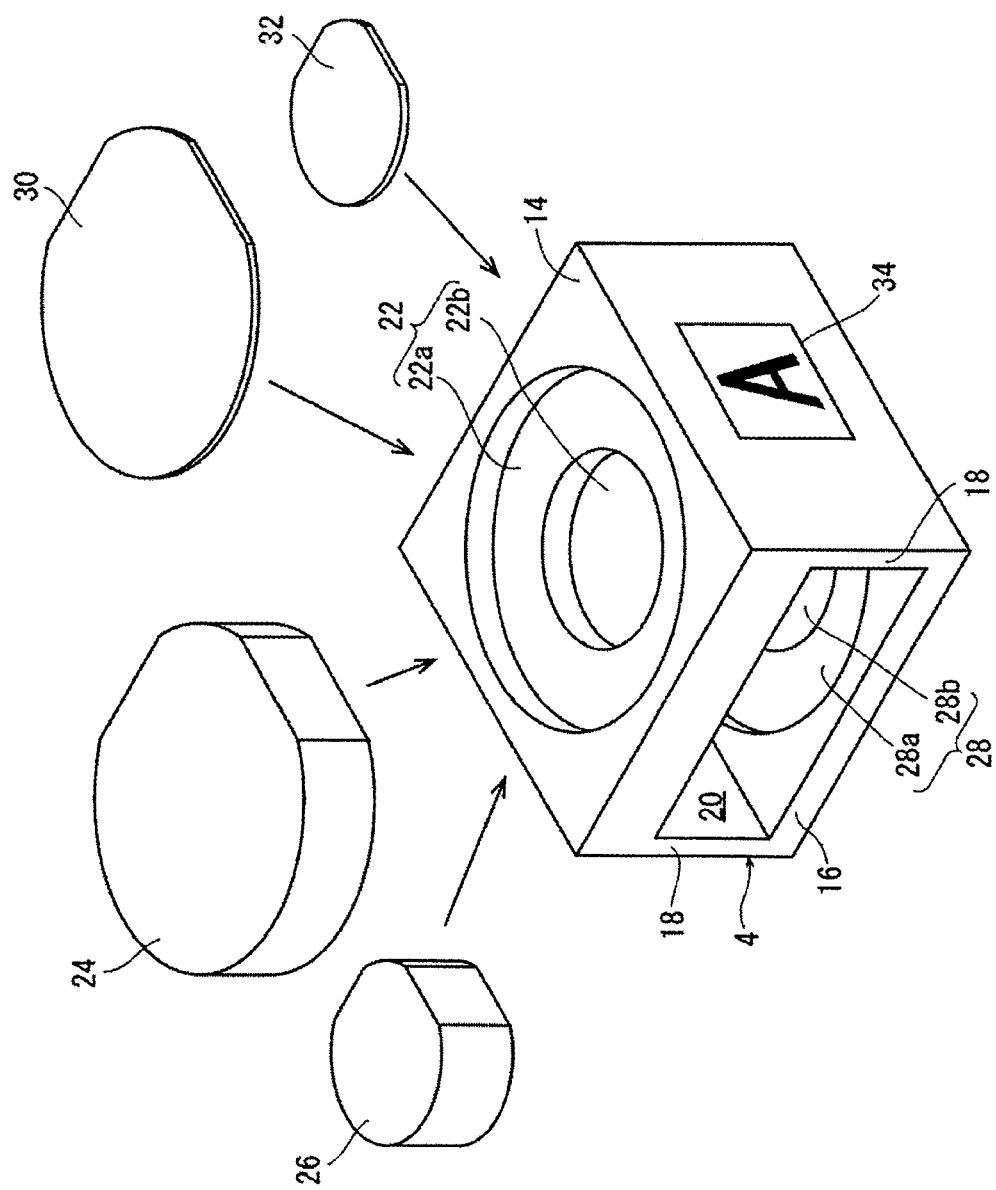
FIG. 2 is a perspective view of a conveying tray depicted in FIG. 1.

Referring to FIG. 2, the conveying tray 4 includes a rectangular upper wall 14, a rectangular lower wall 16 disposed on the lower side of the upper wall 14, a pair of rectangular side walls 18 connecting the upper wall 14 and the lower wall 16, and a tunnel 20 defined by the upper wall 14 and the lower wall 16 and the pair of side walls 18.

An upper surface of the upper wall 14 is formed with an ingot accommodating section 22 that accommodates an ingot. The ingot accommodating section 22 in the present embodiment has an annular first ingot accommodating section 22a recessed downward from the upper surface of the upper wall 14, and a circular second ingot accommodating section 22b smaller than the first ingot accommodating section 22a in diameter and recessed further downward than the first ingot accommodating section 22a. The first ingot accommodating section 22a and the second ingot accommodating section 22b are formed concentrically.

The diameter of the first ingot accommodating section 22a is slightly (by on the order of several mm) larger than a cylindrical ingot 24 having a comparatively large diameter (for example, 6 in), and the first ingot accommodating section 22a accommodates the ingot 24 of a comparatively large diameter. The diameter of the second ingot accommodating section 22b is slightly larger than a cylindrical ingot 26 having a comparatively small diameter (for example, 4 inches), and the second ingot accommodating section 22b accommodates the ingot 26 of a comparatively small diameter.

Thus, the ingot accommodating section 22 of the present embodiment includes the concentric first and second ingot accommodating sections 22a and 22b corresponding to the ingots 24 and 26 of two kinds of sizes. Note that the ingot accommodating section 22 may be a single circular accommodating recess corresponding to an ingot of a single kind of size, or may include a plurality of concentric accommodating recesses corresponding to ingots of three or more kinds of sizes.

As depicted in FIG. 2, an upper surface of the lower wall 16 is formed with a wafer accommodating section 28 for accommodating the wafer formed from an ingot. The wafer accommodating section 28 of the present embodiment includes an annular first wafer accommodating section 28a recessed downward from the upper surface of the lower wall 16, and a circular second wafer accommodating section 28b smaller than the first wafer accommodating section 28a in diameter and recessed further downward than the first wafer accommodating section 28a. The first wafer accommodating section 28a and the second wafer accommodating section 28b are formed concentrically.

The diameter of the first wafer accommodating section 28a is slightly larger than a disk-shaped wafer 30 having a comparatively large diameter (for example, 6 inches in diameter), and the first wafer accommodating section 28a accommodates the wafer 30 of a comparatively large diameter. The diameter of the second wafer accommodating section 28b is slightly larger than a disk-shaped wafer 32 having a comparatively small diameter (for example, 4 inches in diameter), and the second wafer accommodating section 28b accommodates the wafer 32 of a comparatively small diameter.

Thus, the wafer accommodating section 28 of the present embodiment includes the concentric first and second wafer accommodating sections 28a and 28b corresponding to the wafers 30 and 32 of two kinds of sizes. Note that the wafer accommodating section 28 may be a single circular accommodating recess corresponding to the wafer of a single kind of size, or may include a plurality of concentric accommodating recesses corresponding to wafers of three or more kinds of sizes. Note that conversely to the present embodiment, the upper surface of the upper wall 14 may be formed with the wafer accommodating section 28, and the upper surface of the lower wall 16 may be formed with the ingot accommodating section 22.

As illustrated in FIGS. 1 and 2, the conveying tray 4 is provided with an identification mark 34. The identification mark 34 may be any one of a color, a symbol, a character, a figure, a pattern, and a picture, or may be a combination of two or more of a color, a symbol, a character, a figure, a pattern, and a picture. In the present embodiment, characters A, B, C, and D are provided on an outer surface of the side wall of the conveying tray 4 as the identification mark 34, however, a color such as red, blue, green, and yellow may be provided as the identification mark 34, a figure such as WW, XX, YY, and ZZ may be provided, or a picture may be drawn.

As depicted in FIG. 1, the conveying tray 4 accommodating an ingot (in the present embodiment, the ingot 24 of a comparatively large diameter) is accommodated in a conveying tray rack 36. The conveying tray rack 36 in the present embodiment has four accommodating sections 38 penetrating in an X-axis direction indicated by arrow X in FIG. 1. In the conveying tray rack 36, the conveying tray 4 can be accommodated in the accommodating section 38 from the viewer's side in the X-axis direction in FIG. 1, and the conveying tray 4 in the accommodating section 38 can be conveyed out from the depth side in the X-axis direction in FIG. 1. Note that a Y-axis direction indicated by arrow Y in FIG. 1 is a direction orthogonal to the X-axis direction, a Z-axis direction indicated by arrow Z in FIG. 1 is a vertical direction orthogonal to the X-axis direction and the Y-axis direction, and an XY plane defined by the X-axis direction and the Y-axis direction is substantially horizontal.

Figure 3:
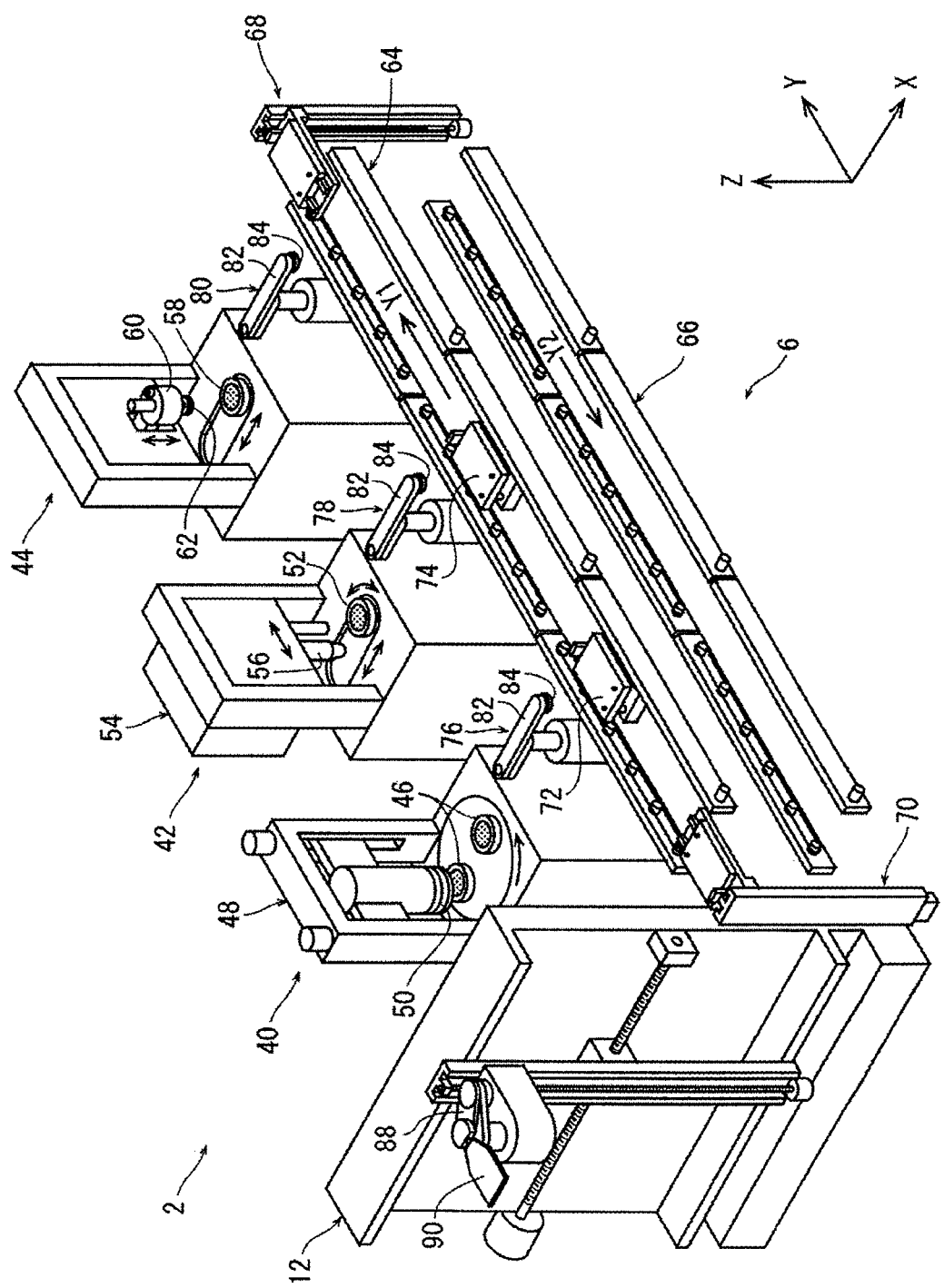
FIG. 3 is a partial perspective view of the wafer forming apparatus depicted in FIG. 1.

Referring to FIGS. 1 and 3, each processing apparatus to which the conveying tray 4 accommodating the ingot is conveyed will be described. The wafer forming apparatus 2 in the present embodiment includes an ingot grinding unit 40, a laser applying unit 42, and a wafer peeling unit 44 as processing apparatuses.

As illustrated in FIG. 3, the ingot grinding unit 40 includes a holding table 46 that suction-holds the ingot and can be rotated, and grinding means 48 that grinds the upper surface of the ingot suction-held by the holding table 46 to planarize the upper surface. The grinding means 48 has a grinding wheel 50 that has grindstones (not illustrated) and can be rotated. The ingot grinding unit 40 brings the grindstones into contact with the upper surface of the ingot, while rotating the holding table 46 with the ingot suction-held thereon and rotating the grinding wheel 50, thereby to grind and planarize the upper surface of the ingot.

The laser applying unit 42 includes a holding table 52 that suction-holds the ingot and is movable in the X-axis direction and is rotatable, and laser applying means 54 that applies a laser beam to the ingot suction-held by the holding table 52. The laser applying means 54 has a light concentrator 56 that concentrates a pulsed laser beam emitted from a laser oscillator (not illustrated) to apply the pulsed laser beam to the ingot and that is movable in the Y-axis direction.

The laser applying unit 42 applies a laser beam of such a wavelength as to be transmitted through the ingot to the ingot, with a focal point of the laser beam positioned at a depth corresponding to the thickness of the wafer to be formed from the upper surface of the ingot, while moving the holding table 52 suction-holding the ingot in the X-axis direction or while moving the light concentrator 56 in the Y-axis direction, thereby forming a peeling layer lowered in strength in the inside of the ingot.

The wafer peeling unit 44 includes a holding table 58 that suction-holds the ingot and can be moved in the X-axis direction, a liquid tank body 60 that cooperates with the holding table 58 in forming a liquid accommodating space, and an ultrasonic vibration generating member 62 that applies an ultrasonic vibration to the ingot suction-held by the holding table 58 and suction-holds the wafer peeled off from the ingot.

The wafer peeling unit 44, after a liquid is accommodated in the liquid accommodating space formed by the holding table 58 suction-holding the ingot and the liquid tank body 60, operates the ultrasonic vibration generating member 62 to apply an ultrasonic vibration to the ingot, thereby peeling off the wafer from the ingot with the peeling layer as a start point.

In the present embodiment, the conveying tray 4 is conveyed by the belt conveyor unit 6 to the ingot grinding unit 40, the laser applying unit 42, and the wafer peeling unit 44.

The belt conveyor unit 6 includes a forward belt conveyor 64 that conveys the conveying tray 4 in a Y1 direction, a backward belt conveyor 66 that conveys the conveying tray 4 in a Y2 direction (direction opposite to Y1), a first conveying unit 68 that conveys the conveying tray 4 from an end point of the forward belt conveyor 64 to a start point of the backward belt conveyor 66 and stops the conveying tray 4 being conveyed by the forward belt conveyor 64 at a position facing the wafer peeling unit 44, and a second conveying unit 70 that conveys the conveying tray 4 from an end point of the backward belt conveyor 66 to a start point of the forward belt conveyor 64.

In addition, the belt conveyor unit 6 includes a first conveying tray stopper 72 that can be lifted up and down and stops the conveying tray 4 being conveyed by the forward belt conveyor 64 at a position facing the ingot grinding unit 40, and a second conveying tray stopper 74 that can be lifted up and down and stops the conveying tray 4 being conveyed by the forward belt conveyor 64 at a position facing the laser applying unit 42.

Further, the belt conveyor unit 6 includes a first moving mechanism 76 that moves the ingot between the conveying tray 4 stopped by the first conveying tray stopper 72 and the ingot grinding unit 40, a second moving mechanism 78 that moves the ingot between the conveying tray 4 stopped by the second conveying tray stopper 74 and the laser applying unit 42, and a third moving mechanism 80 that moves the ingot between the conveying tray 4 stopped by the first conveying unit 68 and the wafer peeling unit 44 and moves the wafer peeled off from the ingot from the wafer peeling unit 44 to the conveying tray 4.

The first, second, and third moving mechanisms 76, 78, and 80 which may have a common configuration each include an articulated arm 82 movable in the X-axis direction, the Y-axis direction, and the Z-axis direction, and a suction piece 84 attached to a tip of the articulated arm 82 such as to be reversible upside down. One surface of the suction piece 84 is formed with a plurality of suction holes (not illustrated) connected to suction means (not illustrated).

As depicted in FIG. 1, the cassette rack 10 in the present embodiment has sixteen accommodating sections 86 that penetrate in the Y-axis direction. The cassettes 8 that accommodate the wafers peeled off from the ingot are accommodated in each accommodating section 86. In the cassette rack 10, the cassettes 8 can be accommodated into the accommodating sections 86 from the viewer's side in the Y-axis direction in FIG. 1, and the wafers can be accommodated in the cassettes 8 in the accommodating sections 86 from the depth side in the Y-axis direction in FIG. 1.

It is important that the cassette rack 10 corresponding to the conveying tray 4 is provided with the same identification mark 34' as the identification mark 34 provided on the conveying tray 4, or the cassette 8 corresponding to the conveying tray 4 is provided with the same identification mark 34" as the identification mark 34 provided on the conveying tray 4. In the present embodiment, the same characters A, B, C, and D as the identification marks 34 of the conveying trays 4 are provided as the identification marks 34' on the accommodating sections 86 of the cassette rack 10, and the same characters A, B, C, and D as the identification marks 34 of the conveying trays 4 are provided as the identification marks 34" on outer surfaces of the cassettes 8. On the accommodating sections 86 of the cassette rack 10, the cassette 8 provided with the same identification mark 34" as the identification mark 34' of each accommodating section 86 is placed. Note that in FIG. 1, the identification marks 34' are provided on only the accommodating sections 86 at the uppermost stage of the cassette rack 10, but the identification marks 34' may be provided also on the other accommodating sections 86.

Referring to FIG. 3, the transferring unit 12 includes an articulated arm 88 that is movable in the X-axis direction, the Y-axis direction, and the Z-axis direction, and a suction piece 90 attached to a tip of the articulated arm 88 such as to be reversible upside down. One surface of the suction piece 90 is formed with a plurality of suction holes (not illustrated) connected to suction means (not illustrated). The transferring unit 12 conveys the conveying tray 4 in the conveying tray rack 36 to the belt conveyor unit 6, and transfers the wafer from the wafer accommodating section 28 of the conveying tray 4 to the cassette 8 placed on the cassette rack 10.

At the time of forming a wafer from an ingot by the wafer forming apparatus 2, as depicted in FIG. 1, first, one or more ingots (in the present embodiment, four ingots 24 having a large diameter) are prepared. Next, the respective ingots 24 are accommodated in the first ingot accommodating sections 22a of the conveying trays 4, and the conveying trays 4 accommodating the ingots 24 are accommodated in the conveying tray rack 36.

Subsequently, a first conveying step of conveying the ingot 24 from the conveying tray rack 36 to the laser applying unit 42 is conducted. Ordinarily, the ingot has its end surface planarized to such an extent as not to hinder incidence of a laser beam in the peeling layer forming step described later, and, therefore, an example in which the ingot 24 is conveyed from the conveying tray rack 36 to the laser applying unit 42 in the first conveying step is described in the present embodiment. However, in the case where the end surface of the ingot 24 is not planarized to such an extent as not hinder incidence of the laser beam in the peeling layer forming step, the ingot 24 may be conveyed from the conveying tray rack 36 to the ingot grinding unit 40 in the first conveying step.

In the first conveying step, first, the articulated arm 88 of the transferring unit 12 is driven, and the suction piece 90 with the suction holes directed upward is inserted into the tunnel 20 of the conveying tray 4. Next, the suction piece 90 is slightly raised in the tunnel 20, and the lower surface of the upper wall 14 of the conveying tray 4 is suction-held by the suction piece 90. Subsequently, the conveying tray 4 suction-held by the suction piece 90 is conveyed from the conveying tray rack 36 to the forward belt conveyor 64.

After the conveying tray 4 is placed on the forward belt conveyor 64, the conveying tray 4 is conveyed in the Y1 direction by the forward belt conveyor 64 to a position facing the laser applying unit 42. In this instance, the first conveying tray stopper 72 is lowered, and the second conveying tray stopper 74 is raised, whereby the conveying tray 4 is stopped at a position facing the laser applying unit 42. Next, the articulated arm 82 of the second moving mechanism 78 is driven, and the ingot 24 on the conveying tray 4 is suction-held by the suction piece 84. Subsequently, the ingot 24 suction-held by the suction piece 84 is moved from the conveying tray 4 to the holding table 52 of the laser applying unit 42.

After the first conveying step is carried out, a peeling layer forming step of suction-holding the ingot 24 by the holding table 52, and applying a laser beam of such a wavelength as to be transmitted through the ingot 24 to the ingot 24 with a focal point of the laser beam positioned at a depth corresponding to the thickness of the wafer to be formed from the upper surface of the ingot 24 suction-held by the holding table 52, to form a peeling layer, is conducted at the laser applying unit 42.

After the peeling layer forming step is conducted, a second conveying step of conveying the ingot 24 formed with the peeling layer from the laser applying unit 42 to the wafer peeling unit 44 is performed.

In the second conveying step, first, the articulated arm 82 of the second moving mechanism 78 is driven, the ingot 24 on the holding table 52 is suction-held by the suction piece 84, and the suction force of the holding table 52 is released. Next, the ingot 24 suction-held by the suction piece 84 is moved from the holding table 52 to the first ingot accommodating section 22a of the conveying tray 4.

Subsequently, the conveying tray 4 is conveyed in the Y1 direction by the forward belt conveyor 64 to a position facing the wafer peeling unit 44. In this instance, the conveying tray 4 is stopped at a position facing the wafer peeling unit 44 by the first conveying unit 68. Next, the articulated arm 82 of the third moving mechanism 80 is driven, and the ingot 24 on the conveying tray 4 is suction-held by the suction piece 84. Subsequently, the ingot 24 suction-held by the suction piece 84 is moved from the conveying tray 4 to the holding table 58 of the wafer peeling unit 44.

After the second conveying step is conducted, a wafer peeling step of suction-holding the ingot 24 formed with the peeling layer by the holding table 58, holding the upper surface of the ingot 24 suction-held by the holding table 58, and peeling off the wafer 30 from the ingot 24 with the peeling layer as a start point is carried out at the wafer peeling unit 44.

After the wafer peeling step is performed, a third conveying step of conveying the wafer 30 (see FIG. 2) peeled off from the ingot 24 from the wafer peeling unit 44 to the cassette 8 on the cassette rack 10, and conveying the ingot 24 with the wafer 30 peeled off therefrom from the wafer peeling unit 44 to the ingot grinding unit 40.

In the third conveying step, first, the articulated arm 82 of the third moving mechanism 80 is driven, and the wafer 30 peeled off from the ingot 24 is suction-held by the suction piece 84. Next, the wafer 30 suction-held by the suction piece 84 is moved from the wafer peeling unit 44 to the first wafer accommodating section 28a of the conveying tray 4.

Subsequently, the articulated arm 82 of the third moving mechanism 80 is driven, the ingot 24 on the holding table 58 is suction-held by the suction piece 84, and the suction force of the holding table 58 is released. Next, the ingot 24 suction-held by the suction piece 84 is moved from the holding table 58 to the first ingot accommodating section 22a of the conveying tray 4.

Subsequently, the conveying tray 4 accommodating the ingot 24 and the wafer 30 is conveyed by the first conveying unit 68 from the forward belt conveyor 64 to the backward belt conveyor 66. Next, the conveying tray 4 is conveyed in the Y2 direction by the backward belt conveyor 66, and the conveying tray 4 is transferred to the second conveying unit 70. Subsequently, the conveying tray 4 is conveyed toward the forward belt conveyor 64 by the second conveying unit 70.

Before the conveying tray 4 is transferred from the second conveying unit 70 to the forward belt conveyor 64, the second conveying unit 70 is once stopped. Next, the articulated arm 88 of the transferring unit 12 is driven, and the wafer 30 accommodated in the conveying tray 4 on the second conveying unit 70 is suction-held by the suction piece 90. Then, the wafer 30 suction-held by the suction piece 90 is conveyed out from the conveying tray 4, and the wafer 30 is transferred into the cassette 8 on the cassette rack 10. In this instance, the wafer 30 is transferred to the cassette 8 provided with the same identification mark 34″ as the identification mark 34 of the conveying tray 4.

Subsequently, the second conveying unit 70 is operated, to transfer the conveying tray 4 from the second conveying unit 70 to the forward belt conveyor 64, after which the conveying tray 4 is conveyed in the Y1 direction by the forward belt conveyor 64 to a position facing the ingot grinding unit 40. In this instance, the first conveying tray stopper 72 is raised, whereby the conveying tray 4 is stopped at a position facing the ingot grinding unit 40. Next, the articulated arm 82 of the first moving mechanism 76 is driven, and the ingot 24 on the conveying tray 4 is suction-held by the suction piece 84. Subsequently, the ingot 24 suction-held by the suction piece 84 is moved from the conveying tray 4 to the holding table 46 of the ingot grinding unit 40.

After the third conveying step is conducted, an ingot grinding step of suction-holding the ingot 24 with the wafer 30 peeled off therefrom by the holding table 46 and grinding the upper surface (peeling surface) of the ingot 24 suction-held by the holding table 46 to planarize the upper surface is carried out at the ingot grinding unit 40.

After the ingot grinding step is conducted, a fourth conveying step of conveying the ingot 24 with its upper surface planarized from the ingot grinding unit 40 to the laser applying unit 42 is carried out.

In the fourth conveying step, first, the articulated arm 82 of the first moving mechanism 76 is driven, the ingot 24 on the holding table 46 is suction-held by the suction piece 84, and the suction force of the holding table 46 is released. Next, the ingot 24 suction-held by the suction piece 84 is moved from the holding table 46 to the first ingot accommodating section 22a of the conveying tray 4.

Subsequently, the conveying tray 4 is conveyed in the Y1 direction by the forward belt conveyor 64 to a position facing the laser applying unit 42. Next, the articulated arm 82 of the second moving mechanism 78 is driven, and the ingot 24 on the conveying tray 4 is suction-held by the suction piece 84. Subsequently, the ingot 24 suction-held by the suction piece 84 is moved from the conveying tray 4 to the holding table 52 of the laser applying unit 42.

After the fourth conveying step is performed, the aforementioned peeling layer forming step is carried out at the laser applying unit 42. Then, the peeling layer forming step, the wafer peeling step, the ingot grinding step, and the second to fourth conveying steps are carried out repeatedly, whereby the wafers 30 in the number which can be formed from the ingot 24 are formed, and the wafers 30 are accommodated in the cassette 8 provided with the same identification mark 34" as the identification mark 34 provided on the conveying tray 4.

In the present embodiment, each step performed by the wafer forming apparatus has been described while paying attention to a single ingot 24. After the first conveying step of conveying the ingot 24 from the conveying tray rack 36 to the laser applying unit 42 is conducted, the first conveying step is carried out repeatedly at an appropriate interval, and the peeling layer forming step, the wafer peeling step, the ingot grinding step, and the second to fourth conveying steps are concurrently carried out repeatedly for a plurality of ingots 24, whereby the wafers 30 can be formed in an amount by which the wafers 30 can be formed from the plurality of ingots 24.

In addition, in the wafer forming apparatus 2, the conveying tray 4 is provided with the identification mark 34, and the cassette rack 10 or the cassette 8 corresponding to the conveying tray 4 is provided with the same identification mark 34' or 34" as the identification mark 34 of the conveying tray 4. Therefore, even in the case where service interruption or a trouble is generated and the operation of the wafer forming apparatus 2 is stopped, the wafer 30 can be securely accommodated into the cassette 8 stringed to the ingot 24, and the parent-child relation between the ingot 24 and the wafer 30 is not broken but is always clear.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer forming apparatus for forming a wafer from a semiconductor ingot, the wafer forming apparatus comprising:
    a conveying tray having an ingot accommodating section that accommodates the semiconductor ingot and a wafer accommodating section that accommodates the wafer formed from the semiconductor ingot;
    a belt conveyor unit that conveys the conveying tray to at least one processing apparatus;
    a cassette rack on which cassettes accommodating the wafers are placed correspondingly to the conveying trays; and
    a transferring unit that transfers the wafer from the wafer accommodating section of the conveying tray to the cassette placed on the cassette rack,
    wherein the conveying tray is provided with an identification mark, and the cassette rack or the cassette corresponding to the conveying tray is provided with a same identification mark as the identification mark provided on the conveying tray.

2. The wafer forming apparatus according to claim 1, wherein the identification mark is any one of a color, a symbol, a character, a figure, a pattern, and a picture or a combination thereof.

* * * * *